United States Patent
Nandakumar (10) Patent No.: US 8,865,557 B1
(45) Date of Patent: Oct. 21, 2014

(54) DUAL NSD IMPLANTS FOR REDUCED RSD IN AN NMOS TRANSISTOR

(71) Applicant: Texas Instruments Incorporated, Dallas, TX (US)

(72) Inventor: Mahalingam Nandakumar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/457,209

(22) Filed: Aug. 12, 2014

Related U.S. Application Data (62) Division of application No. 13/689,433, filed on Nov. 29, 2012, now Pat. No. 8,835,270.

(60) Provisional application No. 61/703,686, filed on Sep. 20, 2012, provisional application No. 61/568,396, filed on Dec. 8, 2011.

(51) Int. Cl.
*H01L 21/336* (2006.01)
*H01L 49/02* (2006.01)
*H01L 21/265* (2006.01)

(52) U.S. Cl.
CPC .............. *H01L 28/20* (2013.01); *H01L 28/40* (2013.01); *H01L 21/26513* (2013.01)
USPC ................. 438/306; 438/527; 257/E21.634

(58) Field of Classification Search
USPC ................. 438/548; 257/E21.435
See application file for complete search history.

(56) References Cited

U.S. PATENT DOCUMENTS

2012/0100686 A1* 4/2012 Lu et al. .............. 438/303

* cited by examiner

*Primary Examiner* — Cheung Lee
(74) *Attorney, Agent, or Firm* — John R. Pessetto; Frederick J. Telecky, Jr.

(57) ABSTRACT

In an embodiment of the invention, a method of forming an NMOS (n-type metal-oxide semiconductor) transistor is disclosed. A dual mask pattern is used to ion-implant source/drain regions of the NMOS transistor. The first mask allows first doses of As (arsenic), P (phosphorous) and N (Nitrogen) to be ion-implanted. After these doses are ion-implanted, a high temperature (900-1050 C) spike anneal is performed to activate the formed source/drains. A second mask allows a second dose of phosphorus to be implanted in the source/drain regions. The second dose of the phosphorus is typically higher than the first dose of phosphorus. The second dose of phosphorus lowers the Rsd (resistance of the source and drain regions) and dopes n-type poly-silicon blocks.

4 Claims, 6 Drawing Sheets

DUAL NSD IMPLANTS FOR REDUCED RSD IN AN NMOS TRANSISTOR

This application is a divisional of prior application Ser. No. 13/689,433, filed Nov. 29, 2012, currently pending;

Which claims priority from Provisional Application No. 61/703,686, filed Sep. 20, 2012;

and also claims priority from Provisional Application No. 61/568,396, filed Dec. 8, 2011.

BACKGROUND

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. In addition to being smaller and more portable, personal devices are also requiring increased memory and more computational power and speed. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers. As such, smaller feature sizes, smaller separations between features, and more precise feature shapes are required in integrated circuits (ICs) fabricated on the wafers. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher effective yield in IC fabrication by providing more circuits on a die and/or more die per semiconductor wafer. Techniques that facilitate device scaling and/or increased packing densities are thus desirable.

DETAILED DESCRIPTION

The drawings and description, in general, disclose a method of forming an NMOS (n-type metal-oxide semiconductor) transistor. In an embodiment of the invention a dual mask pattern is used to ion-implant ("implant") source/drain and poly-silicon gate regions of the NMOS transistor. The first mask allows first doses of dopants—As (arsenic), P (phosphorous) and N (Nitrogen) to be ion-implanted. The dopant implantation is followed by a high temperature (900-1050 C) spike anneal to activate and diffuse the dopants in the silicon source-drain and poly-silicon gate regions. After the high temperature spike anneal, a second mask allows a second dose of phosphorus to be implanted in the source/drain and poly-silicon gate regions. The second dose of the phosphorus is typically comparable to or higher than the first dose of phosphorus. The second dose of phosphorus increases the doping level in the source-drain and poly-silicon gate regions resulting in lower the Rsd (source-drain resistance), higher gate capacitance and improved drive current of the NMOS transistor.

Figure 5:
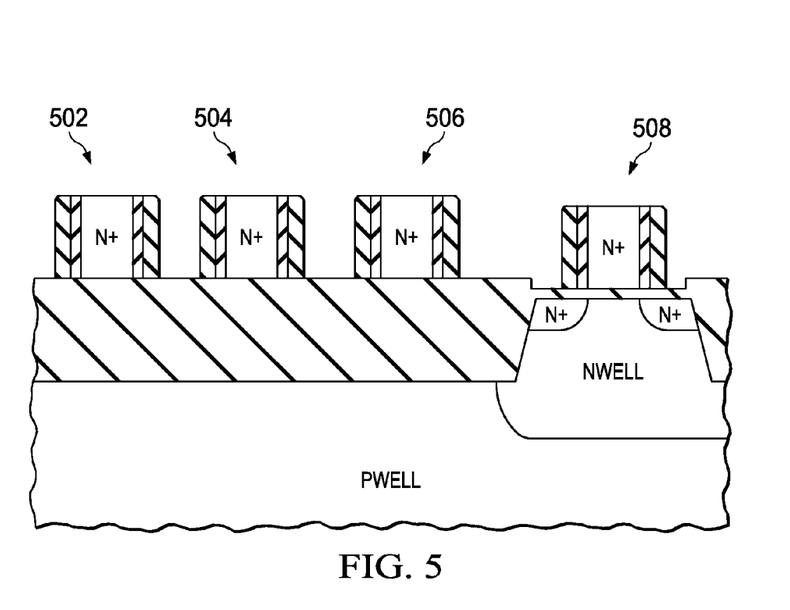
FIG. 5 is a cross-sectional view of three different poly resistors and an Npoly/Nwell capacitor according to an embodiment of the invention.

The first and second masks can also be used on separate NMOS regions to create NMOS transistors with different source-drain doping. For example, high Vt (threshold voltage) transistors, often used in SRAMs to reduce leakage, can be exposed to just the second mask and receive only the second dose of implant while high-performance transistors with a low Vt can be exposed to both masks and receive both the doses of implants. Examples of these types of transistors are shown in FIG. 5 and will be explained in more detail later in the specification.

Figure 6:
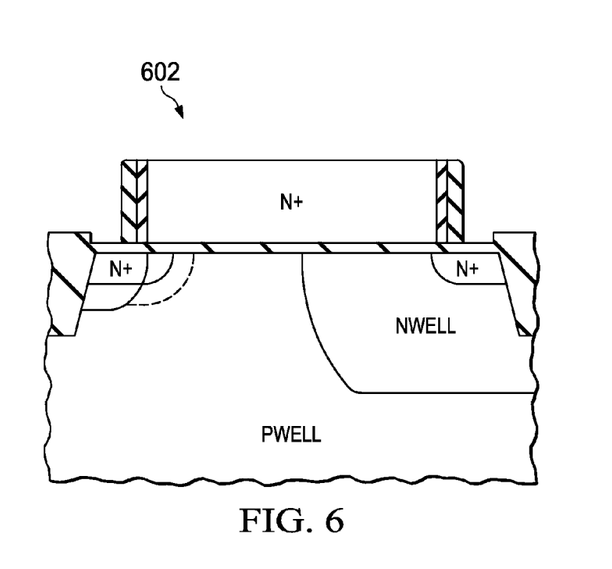
FIG. 6 is a cross-sectional view of a Drain Extended NMOS (DENMOS) a high-voltage transistor according to embodiment of the invention.

In addition, a combination of first and/or second masks can simultaneously be used to expose and dope N+ poly-silicon resistors to achieve desired values of resistance and temperature coefficient of resistivity (TCR). Because of the effective doping of the poly-silicon gate by this scheme, a separate n-type poly-silicon implant masking step prior that is typically performed prior to a gate etching can be avoided. Examples of N+ poly-silicon resistors are shown in FIG. 6 and will be explained in more detail later in the specification.

The thermal budget after the second phosphorus implant is tailored to activate the dopants and prevent the diffusion ("overrun") of the source-drain regions into the channel region of the NMOS transistor. This type of tailoring is achieved by using a combination of a lower temperature spike and/or "millisecond/ultra high temperature (UHT)" laser/flash anneals (e.g. above 1200 C for 100 milliseconds). The tailored thermal budget also limits the diffusion of high dose n-type dopants across the N/P poly boundary in the SRAM. The dual mask scheme with tailored thermal budget described above results in high performance NMOS transistors with reduced threshold voltage variability.

Figure 1:
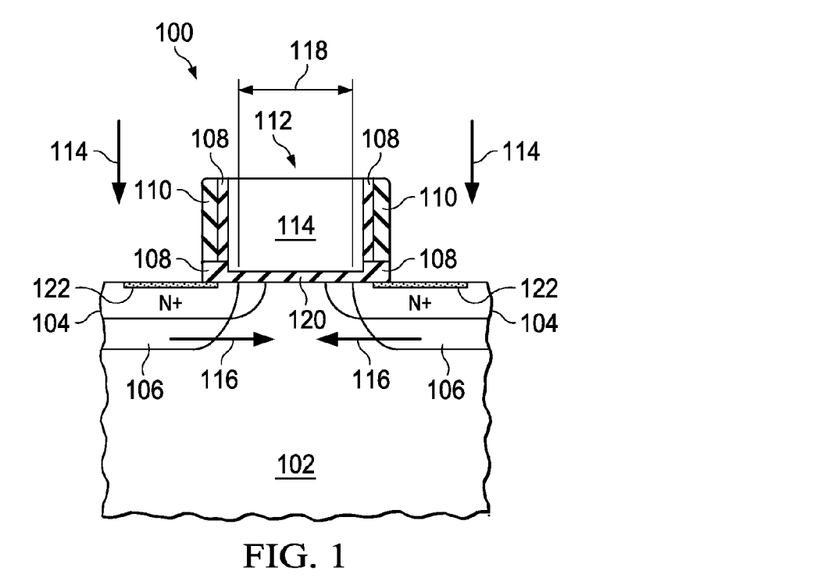
FIG. 1 is cross-sectional view of an embodiment of an NMOS (n-type metal-oxide semiconductor) transistor according to an embodiment of the invention.

FIG. 1 is cross-sectional view of an embodiment of an NMOS (n-type metal-oxide semiconductor) transistor 100. FIG. 1 depicts a NMOS transistor 100 formed on a p-type silicon substrate 102. The gate electrode 112 is formed on the surface of the p-type silicon substrate 102 and is made of polycrystalline ("poly") silicon material. Other conductive and semi-conductive materials may also be used to form the gate electrode. The width of the gate electrode 118 defines the channel, the apparent distance that electrons need to traverse when the transistor has a conducting channel. The actual effective channel length is somewhat shorter than 118.

Below the gate electrode 112 is a dielectric layer 120. The gate dielectric 120 insulates the gate electrode 112 electrically from the silicon substrate 102. In this embodiment, the gate dielectric 120 is formed with silicon dioxide. Other dielectric materials may be used to form the gate dielectric 120. The gate electrode 112 has a first set of sidewall spacers 108. In this embodiment, the first sidewall spacers 108 are formed with silicon dioxide. Other dielectric material may also be used to form the sidewall spacers. A second pair of sidewall spacers 110 is also used. The sidewall spacers 108 and 110 serve multiple purposes in the operation of the NMOS transistor 100. One purpose is to provide an electrical separation between the silicided regions 122. Another purpose is to act as an ion-implant mask during the source/drain formation. The source/drain regions 104 and 106 are the two terminals through which the transistor current is designed to flow when a voltage signal greater than a threshhold voltage $V_T$ is applied to the gate electrode 112.

The source/drain regions 104 and 106 of NMOS transistors are commonly formed by an ion-implantation using a dopants 114 such as phosphorus (other n-type dopants may be used as well). As transistors become smaller, the sidewall spacers 108 and 110 become smaller. As a result, it becomes more difficult to make deeper source/drain regions 106 without the source/drain dopants 114 "over-running" 116 into the channel of the NMOS transistor 100. Deeper source/drain regions are need in order to provide lower Rsd resistance and to adequately dope the gate electrode 112.

Figure 2:
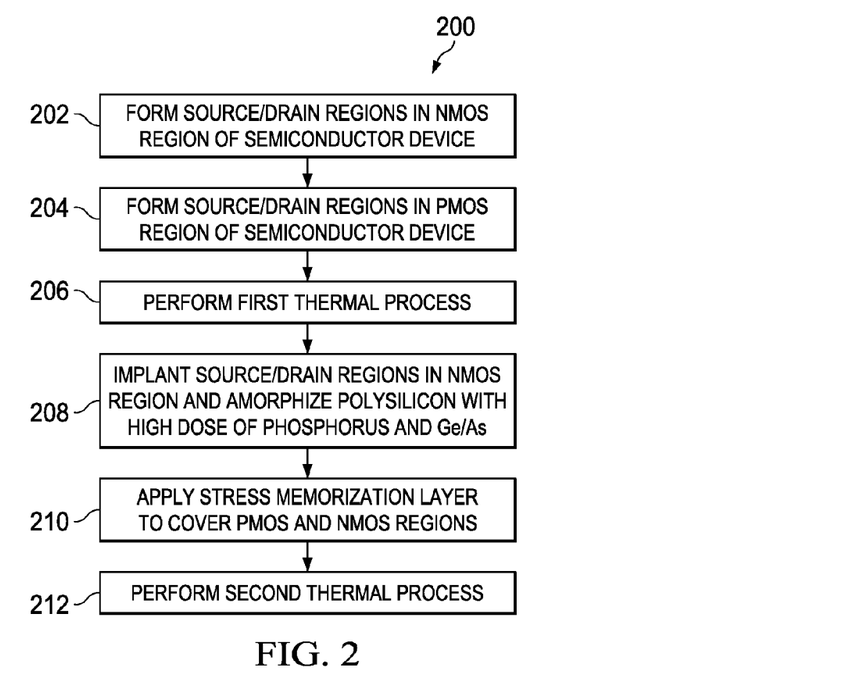
FIG. 2 is a flow diagram illustrating forming n-type source/drain regions with first and second ion-implants according to an embodiment of the invention.

FIG. 2 is a flow diagram illustrating forming n-type source/drain regions with first and second ion-implants according to an embodiment of the invention. While the exemplary method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

In addition, while a particular feature of the invention may have been disclosed with respect to one of several implementations, such feature may be combined with one or more other features of other implementations as may be desired and advantageous for any given or particular application. Furthermore, the methods according to the present invention may be implemented in association with the fabrication of ICs, n-type transistors, n-type resistors, and n-type capacitors illustrated and described herein, as well as in association with other transistors and structures not illustrated, including but not limited to tri-gate field-effect transistors and FINFETs.

In an embodiment of the invention, the ion-plantation of the source/drain regions 106 is accomplished using two separate implants and two n-type source/drain masks NSD1 and NSD2 as shown in FIG. 2. The method 200 begins at block 202 wherein a layer of photo resist is deposited and patterned with a first n-type source/drain mask NSD1 to expose all or portions of NMOS regions while covering PMOS regions. Subsequently n-type dopants are implanted into the exposed NMOS regions to dope the gate poly-silicon and form source/drain regions in the active areas. In this example the n-type dopant includes arsenic As, nitrogen N and a relatively low dose of phosphorous P. In other embodiments, germanium Ge and carbon C may be implanted along with As, N and P. Ge and C are added to better control dopant diffusion and to reduce defects.

At block 204 a layer of resist is formed and patterned with a p-type source/drain mask PSD to expose the PMOS region while covering NMOS region. This is followed by selective implantation of p-type dopants to dope the gate poly-silicon and form the source/drain regions in the active areas of the PMOS region. In this example the p-type dopant includes germanium Ge and boron B. Continuing at block 206, a thermal process is performed that activates the implanted p-type and n-type dopants and restores the crystalline lattice structure of the semiconductor wafer (since the placement of dopants may have disrupted the crystalline lattice). In an embodiment of the invention, the thermal process includes a combination of ultra high temperature millisecond (UHT) anneal (e.g. above 1200 C for 100 milliseconds), typically laser or flash anneal and/or a high temperature spike anneal within an approximate temperature range of 900-1100 degrees Celsius for a relatively short duration (e.g. about 5 seconds or less).

At block 208, a layer of resist is formed and patterned with a second n-type source/drain mask NSD2 to expose all or a portion of the NMOS regions while covering the PMOS regions. The NMOS regions exposed by mask NSD2 may include a part, none or all of the regions which were exposed by mask NSD1 (shown in step 202). The exposed NMOS regions are now implanted with a second relatively high dose of phosphorous, which lowers the NMOS source-drain resistance Rsd. Typically, the second P implant dose is high enough to amorphize the source-drain and gate poly-silicon. However, an additional dose of Ge or As may also be implanted to provide additional amorphization of the gate poly-silicon which in turn facilitates stress memorization (in the next step 210) and performance improvement. Carbon may also be implanted to control phosphorus diffusion. As stated earlier, any combination of the two n-type masks, NSD1 and NSD2 masks (i.e. NSD1 only, NSD2 only, and NSD1 and NSD2 together) may be used to create different source-drain doping levels on different types of transistors—e.g. high Vt (often used in SRAMs) and low Vt (often used in the core logic of integrated circuits). These combinations of NSD1 and NSD2 may also be used to form N+ Polysilicon resistors with different values of resistance and temperature coefficient of resistivity (TCR).

At block 210, a stress memorization (SMT) layer, also referred to as a stacked poly cap or poly cap layer, is formed over the NMOS and PMOS regions. The SMT layer is formed by depositing and/or growing one or more layers of materials (e.g., oxide, nitride, and the like) that introduce a desired type of strain in the NMOS region of the device when subjected to a thermal process. Generally, the SMT layer is formed over active regions and gate electrodes of transistor devices in both the NMOS region and a PMOS region of the semiconductor device. In certain processes, SMT stress in the PMOS transistors may be reduced or eliminated by implantation or removal of the SMT layer over the PMOS regions. A suitable SMT layer is comprised of a lower insulative layer (e.g., oxide) and a middle layer formed on the lower layer comprised of a suitable material and thickness that introduces a desired amount of strain (e.g., nitride). However, the SMT layer can comprise additional layers.

A second thermal process, in this example a UHT laser anneal is performed at block 212 that causes the SMT layer to introduce a type of strain (e.g., uni-axial tensile strain or biaxial tensile strain) across channel regions of transistor devices and enhance performance of transistor devices within the NMOS region. The laser anneal locks in the SMT stress without causing added phosphorous diffusion. In another example, a low temperature (about 900-1000 C) spike is included with the UHT laser anneal. Subsequently, the SMT layer is removed (not shown in FIG. 2), which allows subsequent fabrication procedures, such as silicidation and metallization, to be performed.

It is noted that because n-type doping can be allowed to dope n-type poly-silicon blocks during mask steps NSD1 and NSD2, an n-type poly pre-etch gate implant mask can be removed from the process flow.

Figure 3:
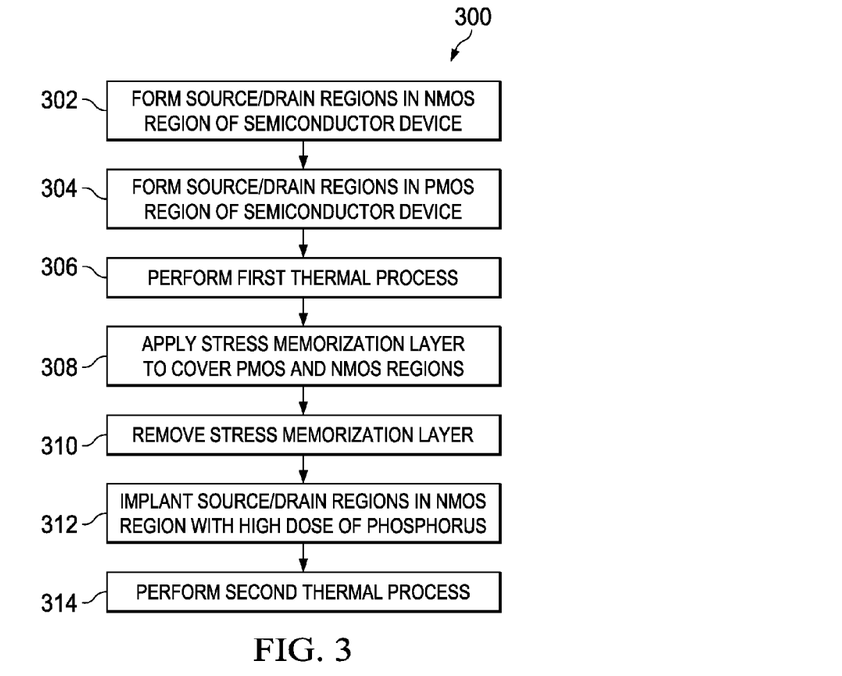
FIG. 3 is a flow diagram illustrating forming n-type source/drain regions with first and second ion-implants according to an embodiment of the invention.

FIG. 3 is a flow diagram illustrating forming n-type source/drain regions with first and second ion-implants according to an embodiment of the invention. While the exemplary method 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

In addition, while a particular feature of the invention may have been disclosed with respect to one of several implementations, such feature may be combined with one or more other features of other implementations as may be desired and advantageous for any given or particular application. Furthermore, the methods according to the present invention may be implemented in association with the fabrication of ICs, n-type transistors, n-type resistors, and n-type capacitors illustrated and described herein, as well as in association with other transistors and structures not illustrated, including but not limited to tri-gate field-effect transistors and FINFETs.

In an embodiment of the invention, the ion-plantation of the source/drain regions 106 is accomplished using two separate implants and two n-type source/drain masks NSD1 and NSD2 as shown in FIG. 3. The method 300 begins at block 302 wherein a layer of photo resist is deposited and patterned with a first n-type source/drain mask NSD1 to expose all or portions of NMOS regions while covering PMOS regions. Subsequently n-type dopants are implanted into the exposed NMOS regions to dope the gate poly-silicon and form source/drain regions in the active areas. In this example the n-type dopant includes arsenic As, nitrogen N and a relatively low dose of phosphorous P. In other embodiments, germanium Ge and carbon C may be implanted along with As, N and P. Ge and C are added to better control dopant diffusion and to reduce defects.

At block 304 a layer of resist is formed and patterned with a p-type source/drain mask PSD to expose the PMOS region while covering NMOS region. This is followed by selective implantation of p-type dopants to dope the gate poly-silicon and form the source/drain regions in the active areas of the PMOS region. In this example the p-type dopant includes germanium Ge and boron B. Continuing at block 306, a thermal process is performed that activates the implanted p-type and n-type dopants and restores the crystalline lattice structure of the semiconductor wafer (since the placement of dopants may have disrupted the crystalline lattice). In an embodiment of the invention, the thermal process includes a combination of ultra high temperature millisecond (UHT) anneal (typically laser or flash anneal) and/or a high temperature spike anneal within an approximate temperature range of 900-1100 degrees Celsius for a relatively short duration (e.g. about 5 seconds or less).

At block 308, a stress memorization (SMT) layer, also referred to as a stacked poly cap or poly cap layer, is formed over the NMOS and PMOS regions. The SMT layer is formed by depositing and/or growing one or more layers of materials (e.g., oxide, nitride, and the like) that introduce a desired type of strain in the NMOS region of the device when subjected to a thermal process. Generally, the SMT layer is formed over active regions and gate electrodes of transistor devices in both the NMOS region and a PMOS region of the semiconductor device. In certain processes, SMT stress in the PMOS transistors may be reduced or eliminated by implantation or removal of the SMT layer over the PMOS regions. A suitable SMT layer is comprised of a lower insulative layer (e.g., oxide) and a middle layer formed on the lower layer comprised of a suitable material and thickness that introduces a desired amount of strain (e.g., nitride). However, the SMT layer can comprise additional layers. At block 310, the SMT layer is removed.

At block 312, a layer of resist is formed and patterned with a second n-type source/drain mask NSD2 to expose all or a portion of the NMOS regions while covering the PMOS regions. The NMOS regions exposed by mask NSD2 may include a part, none or all of the regions which were exposed by mask NSD1 (in step 202). The exposed NMOS regions are now implanted with a second relatively high dose of phosphorous, which lowers the NMOS source-drain resistance Rsd. Typically, the second P implant dose is high enough to amorphize the source-drain and gate poly-silicon. However, an additional dose of Ge or As may also be implanted to provide additional amorphization of the gate poly-silicon. Carbon may also be implanted to control phosphorus diffusion. As stated earlier, any combination of the two n-type masks, NSD1 and NSD2 (i.e. NSD1 only, NSD2 only, and NSD1 and NSD2 together) may be used to create different source-drain doping levels on different types of transistors (high Vt (often used in SRAMs) and low Vt (often used in the core logic of integrated circuits). These combinations of NSD1 and NSD2 may also be used to form N+ Polysilicon resistors with different values of resistance and temperature coefficient of resistivity (TCR).

A second thermal process, in this example a UHT laser anneal, is performed at block 314. In another example, a low temperature (about 900-950 C) spike is included with the UHT laser anneal.

Figure 4A:
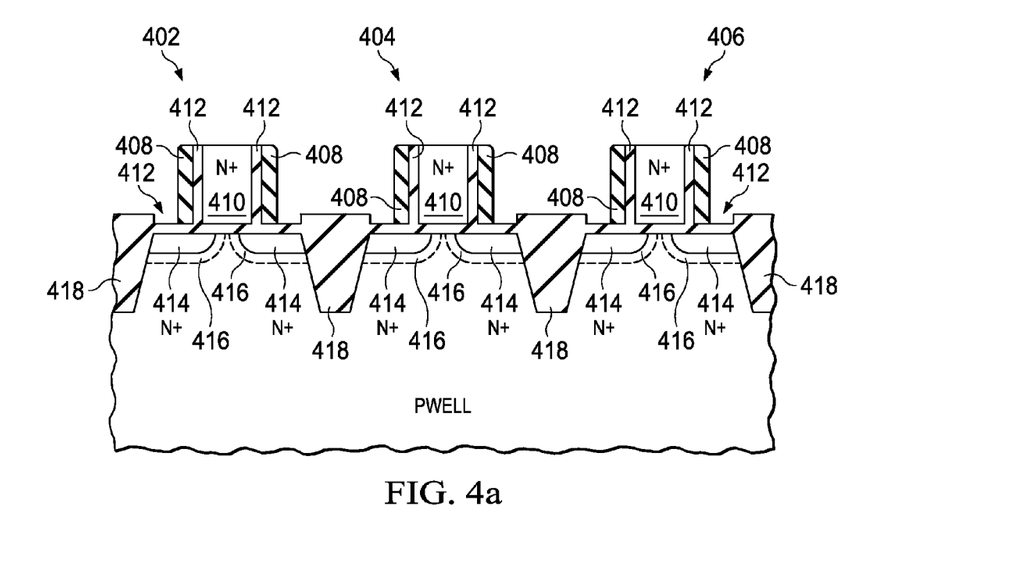
FIG. 4a is a cross-sectional view of a process step for manufacturing three different NMOS (n-type metal-oxide semiconductor) transistors according to an embodiment of the invention.
Figure 4B:
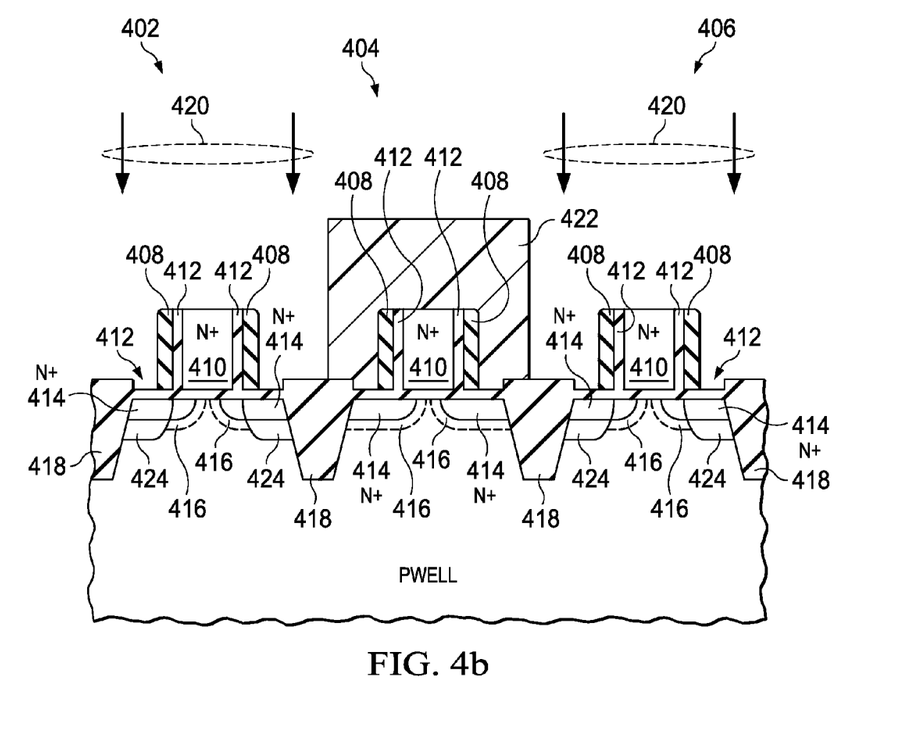
FIG. 4b is a cross-sectional view of a process step for manufacturing three different NMOS (n-type metal-oxide semiconductor) transistors according to an embodiment of the invention.
Figure 4C:
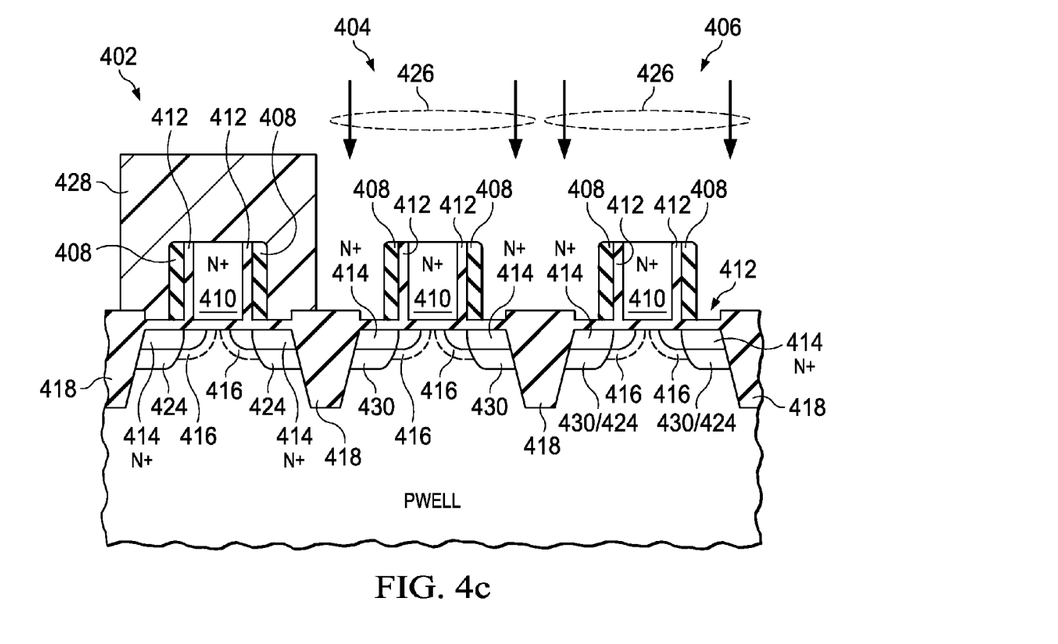
FIG. 4c is a cross-sectional view of a process step for manufacturing three different NMOS (n-type metal-oxide semiconductor) transistors according to an embodiment of the invention.
Figure 4D:
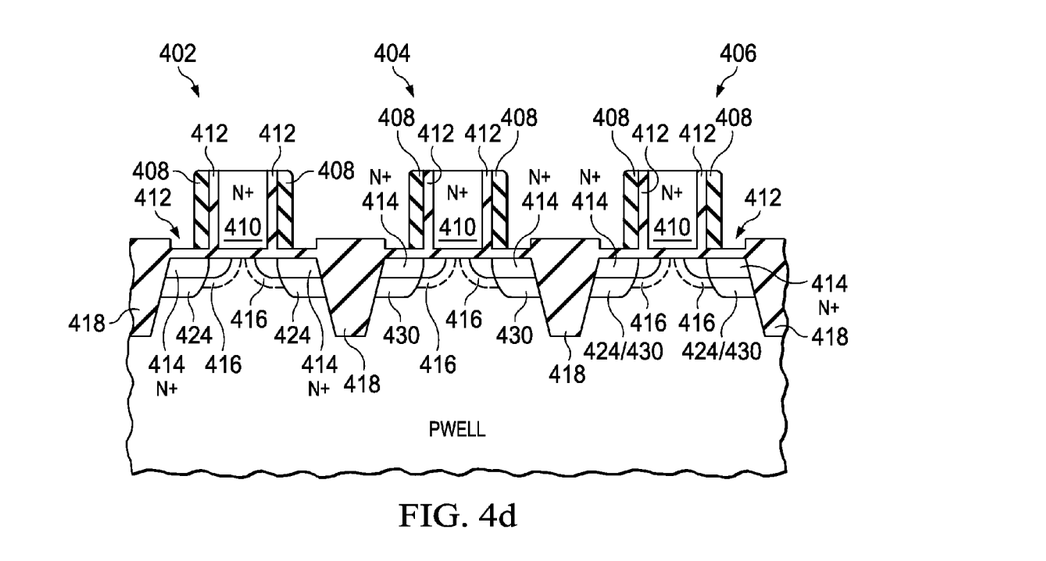
FIG. 4d is a cross-sectional view of a process step for manufacturing three different NMOS (n-type metal-oxide semiconductor) transistors according to an embodiment of the invention.
Figure 4E:
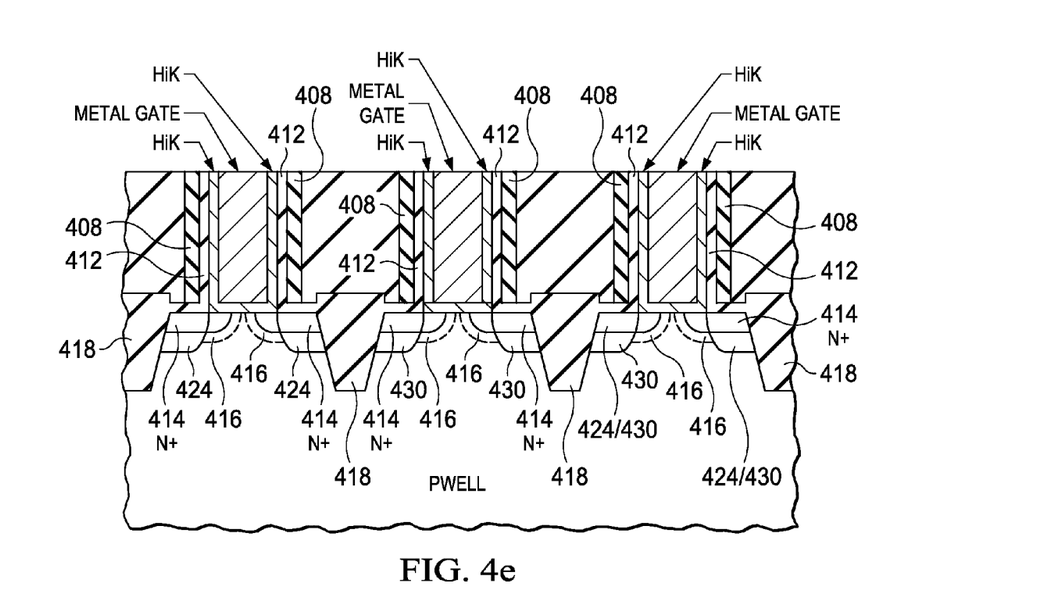
FIG. 4e is a cross-sectional view of a process step for manufacturing three different NMOS (n-type metal-oxide semiconductor) transistors according to an embodiment of the invention.

FIGS. 4a-4e illustrate some of the process steps used to manufacture three different type of NMOS transistors 402, 404 and 406 according to an embodiment of the invention. FIG. 4a illustrates a step in the process where the gate electrodes 410, first 412 and second 408 sidewall spacers, dielectric layer 412, lightly doped source/drain regions 414, halo (pocket implant) layer 416 and isolation 418 has been formed for NMOS transistors 402, 404 and 406. FIG. 4b illustrates a step in the process where a resist 422 is formed over NMOS transistor 404 and a first n-type source/drain 424 implant 420 is applied to the NMOS transistors 402 and 406. FIG. 4c illustrates a step in the process where a resist 428 is formed over NMOS transistor 402 and a second n-type source/drain 430 implant 426 is applied to the NMOS transistors 404 and 406. FIG. 4d illustrates a step after SMT and thermal anneal has been completed. In FIG. 4d, NMOS transistor 502 has source/drains formed from implant 520. NMOS transistor 504 has source/drains formed from implant 526 while NMOS transistor 506 has source/drains formed from implants 520 and 526. In FIG. 4e, the poly gates and the dielectric material surrounding the poly gates are removed and replaced with metal gates and high K (dielectric) material.

FIG. 5 is a cross-sectional view of three different poly resistors 502, 504, 506 and an Npoly/Nwell capacitor 508 according to an embodiment of the invention. The first poly resistor 502 is doped with a first n-type source/drain implant 420. The second poly 504 resistor is doped with a second n-type source/drain implant 426. The third poly resistor 506 is doped with the first n-type source/drain implant 420 and the second n-type source/drain implant 426. The Npoly/Nwell capacitor 508 may be doped with the first n-type source/drain implant 420 alone, or the second n-type source/drain implant 426 alone or with both implant 520 and 426 together.

FIG. 6 is a cross-sectional view of a Drain Extended NMOS (DEN MOS) high-voltage transistor 602 according to embodiment of the invention. The DENMOS high-voltage transistor 602 may be doped with the first n-type source/drain implant 420 alone, or the second n-type source/drain implant 426 alone or with both implant 420 and 426 together.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A method of forming a portion of an integrated circuit comprising:
    implanting a first dose of phosphorus, a first dose of arsenic and a first dose of nitrogen into a first poly silicon block and a second poly silicon block;
    performing a first thermal process that activates the first dose of phosphorous, the first dose of arsenic and the first dose of nitrogen;
    implanting a second dose of phosphorus into a third poly silicon block and the first poly silicon block.

2. The method of claim 1 wherein the second dose of phosphorus is equal to or larger than the first dose of phosphorus.

3. The method of claim 1 wherein a first type of n-type resistor is formed by the first poly silicon block, wherein a second type of n-type resistor is formed by the second poly silicon block and a third type of n-type resistor is formed by the third poly silicon block.

4. The method of claim 1 wherein a first type of capacitor is formed by the first poly silicon block, wherein a second type of capacitor is formed by the second poly silicon block and a third type of capacitor is formed by the third poly silicon block.

* * * * *